United States Patent
Fang

(10) Patent No.: US 10,944,468 B2
(45) Date of Patent: Mar. 9, 2021

(54) HIGH GAIN ACTIVE RELAY ANTENNA SYSTEM

(71) Applicant: Metawave Corporation, Palo Alto, CA (US)

(72) Inventor: Jun Fang, San Jose, CA (US)

(*) Notice: Subject to any disclaimer, the term of this patent is extended or adjusted under 35 U.S.C. 154(b) by 0 days.

(21) Appl. No.: 16/671,028

(22) Filed: Oct. 31, 2019

(65) Prior Publication Data

US 2020/0136718 A1  Apr. 30, 2020

Related U.S. Application Data

(60) Provisional application No. 62/753,745, filed on Oct. 31, 2018.

(51) Int. Cl.
| | |
|---|---|
| *H04B 7/155* | (2006.01) |
| *H01Q 21/22* | (2006.01) |
| *H01Q 3/36* | (2006.01) |
| *H03F 3/21* | (2006.01) |
| *H03F 3/68* | (2006.01) |

(Continued)

(52) U.S. Cl.
CPC .......... *H04B 7/15535* (2013.01); *H01Q 3/36* (2013.01); *H01Q 21/22* (2013.01); *H03F 3/211* (2013.01); *H03F 3/213* (2013.01); *H03F 3/68* (2013.01); *H03G 3/3042* (2013.01); *H04B 7/15507* (2013.01); *H03F 2200/294* (2013.01); *H03F 2200/451* (2013.01); *H03G 2201/106* (2013.01); *H03G 2201/206* (2013.01)

(58) Field of Classification Search
CPC .... H01Q 21/22; H01Q 3/36; H03F 2200/294; H03F 2200/451; H03F 3/211; H03F 3/213; H03F 3/68; H03G 2201/106; H03G 2201/206; H03G 3/3042; H04B 7/15507; H04B 7/15535
USPC .......... 455/7, 11.1, 14, 15, 446, 326, 562.1, 455/422.1; 370/15; 343/770; 330/302
See application file for complete search history.

(56) References Cited

U.S. PATENT DOCUMENTS

| | | | | |
|---|---|---|---|---|
| 5,737,687 A * | 4/1998 | Martin | .................. | H04W 52/52 455/14 |
| 6,640,111 B1 * | 10/2003 | Shapira | .................. | H01Q 1/246 455/562.1 |

(Continued)

OTHER PUBLICATIONS

Damiano Patron, "Compact Reconfigurable Antennas for Wireless Systems and Wearable Applications," Doctoral Thesis to Drexel University of Doctor of Philosophy, May 2015. (filed in 3 parts).

(Continued)

*Primary Examiner* — Tan H Trinh
(74) *Attorney, Agent, or Firm* — Sandra Lynn Godsey

(57) ABSTRACT

Examples disclosed herein relate to a high gain active relay antenna system. The active relay antenna system comprises a first antenna pair having a first receive antenna and a first transmit antenna to communicate wireless signals in a forward link from a base station to a plurality of users; and a second antenna pair having a second receive antenna and a second transmit antenna to communicate wireless signals in a return link from the plurality of users to the base station. The active relay antenna system further comprises a first active relay section and a second active relay section to provide for adjustable power gain in the wireless signals.

20 Claims, 12 Drawing Sheets

(51) Int. Cl.
*H03G 3/30* (2006.01)
*H03F 3/213* (2006.01)

(56) References Cited

U.S. PATENT DOCUMENTS

| | | | | |
|---|---|---|---|---|
| 7,495,515 | B1* | 2/2009 | Branch | H03F 1/56 330/302 |
| 10,548,026 | B1* | 1/2020 | Liu | H04L 12/2801 |
| 2004/0110469 | A1* | 6/2004 | Judd | G01S 19/25 455/15 |
| 2004/0166802 | A1* | 8/2004 | McKay, Sr. | H04B 7/1555 455/15 |
| 2004/0219876 | A1* | 11/2004 | Baker | H04B 7/15535 455/7 |
| 2006/0121873 | A1* | 6/2006 | Ammar | G01K 11/006 455/326 |
| 2006/0264210 | A1* | 11/2006 | Lovberg | H04W 92/20 455/422.1 |
| 2009/0258652 | A1* | 10/2009 | Lambert | H04W 88/04 455/446 |
| 2010/0285736 | A1* | 11/2010 | Gore | H04L 27/2607 455/7 |
| 2010/0291865 | A1* | 11/2010 | Gore | H04B 7/15571 455/7 |
| 2013/0028170 | A1* | 1/2013 | Periyalwar | H04B 7/15542 370/315 |
| 2013/0285866 | A1* | 10/2013 | Watanabe | H01Q 5/49 343/770 |
| 2017/0201019 | A1* | 7/2017 | Trotta | H01Q 3/267 |
| 2018/0183390 | A1* | 6/2018 | Benjamin | H03F 1/32 |
| 2018/0337641 | A1* | 11/2018 | Prentice | H04B 10/272 |
| 2019/0253145 | A1* | 8/2019 | Prentice | H04B 10/40 |
| 2020/0028262 | A1* | 1/2020 | Fang | H04B 7/145 |

OTHER PUBLICATIONS

Haifeng Zhou, et al. "Evolution of Satellite Communication Antennas on Mobile Ground Terminals," Hindawi Publishing Corporation, International Journal of Antennas and Propagation, vol. 2015, Article ID 432650, pp. 1-15, Jul. 2015.

* cited by examiner

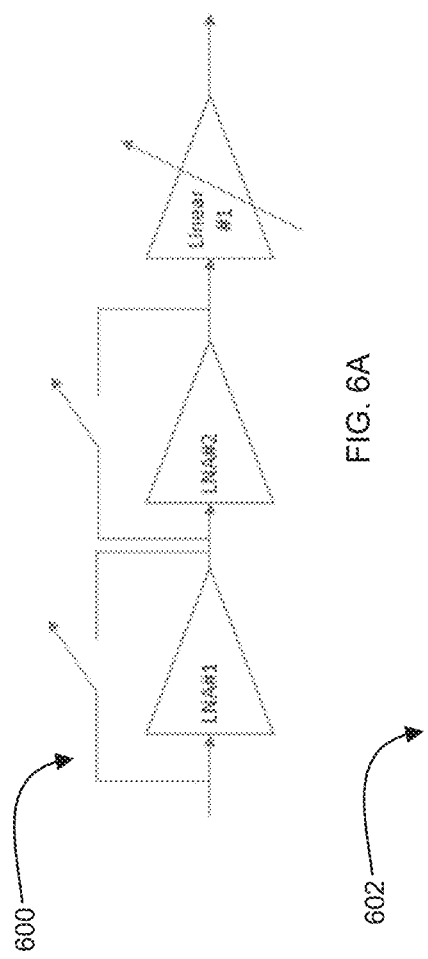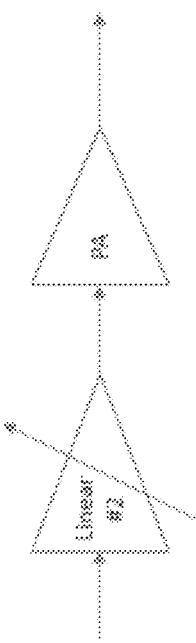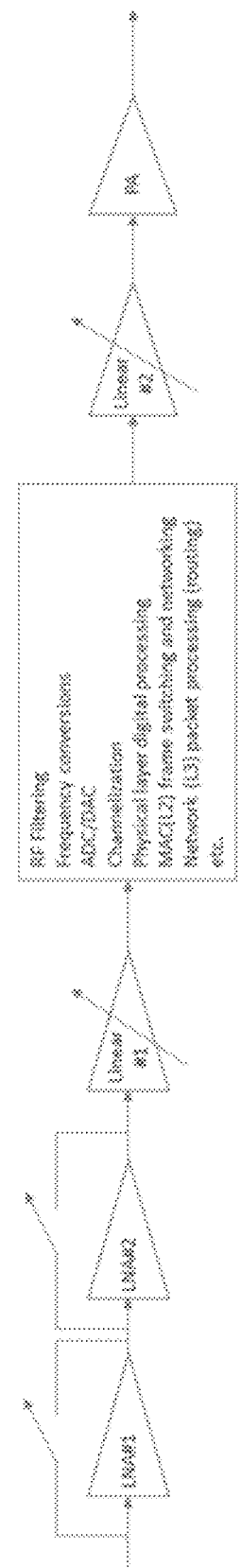
FIG. 6A
FIG. 6B
FIG. 6C

HIGH GAIN ACTIVE RELAY ANTENNA SYSTEM

CROSS REFERENCE TO RELATED APPLICATION

The present application claims priority to U.S. Provisional Patent Application Ser. No. 62/753,745, filed on Oct. 31, 2018, which is incorporated by reference in its entirety.

BACKGROUND

New generation wireless networks are increasingly becoming a necessity to accommodate user demands. Mobile data traffic continues to grow every year, challenging the wireless networks to provide greater speed, connect more devices, have lower latency, and transmit more and more data at once. Users now expect instant wireless connectivity regardless of the environment and circumstances, whether it is in an office building, a public space, an open preserve, or a vehicle. In response to these demands, a new wireless standard known as the fifth generation new radio ("5G NR") has been designed for deployment in the near future. The fifth generation ("5G") standards extend operations to millimeter wave bands, which covers frequencies beyond 6 gigahertz ("GHz"), and to planned 24 GHz, 26 GHz, 28 GHz, and 39 GHz, and up to 300 GHz, all over the world.

The millimeter wave spectrum provides narrow wavelengths in the range of approximately one to ten millimeters, which are susceptible to high atmospheric attenuation and have to operate over short ranges (about one kilometer or so). In millimeter wave systems, array antennas present several advantages by providing high gain, narrow beams, and beam steerability. For dense-scattering areas (e.g., street canyons, in buildings, and in shopping malls), due to multipath by shadowing and geographical obstructions, blind spots may exist. For remote areas, where the ranges are longer and sometimes extreme climatic conditions with heavy precipitation exist, operators are prevented from using large array antennas due to strong winds and storms. These and other challenges in providing millimeter wave wireless communications for 5G networks impose stringent requirements on system design, including the ability to generate desired beamforms at a controlled direction, while avoiding interference among the many signals and structures of the surrounding environment. Compared to previously deployed relay scenarios, different millimeter wave band relay solutions would be required to meet the very different and varying operational requirements in terms of performance and cost.

BRIEF DESCRIPTION OF THE DRAWINGS

The present application may be more fully appreciated in connection with the following detailed description taken in conjunction with the accompanying drawings, which may not be drawn to scale and in which like reference characters refer to like parts throughout, and in which:

FIGS. 6A, 6B, and 6C illustrate other example implementations in which an active relay is split into two separate functionalities, which are provided by a separate receive architecture and transmit architecture, according to various implementations of the subject technology;

DETAILED DESCRIPTION

Figure 1:
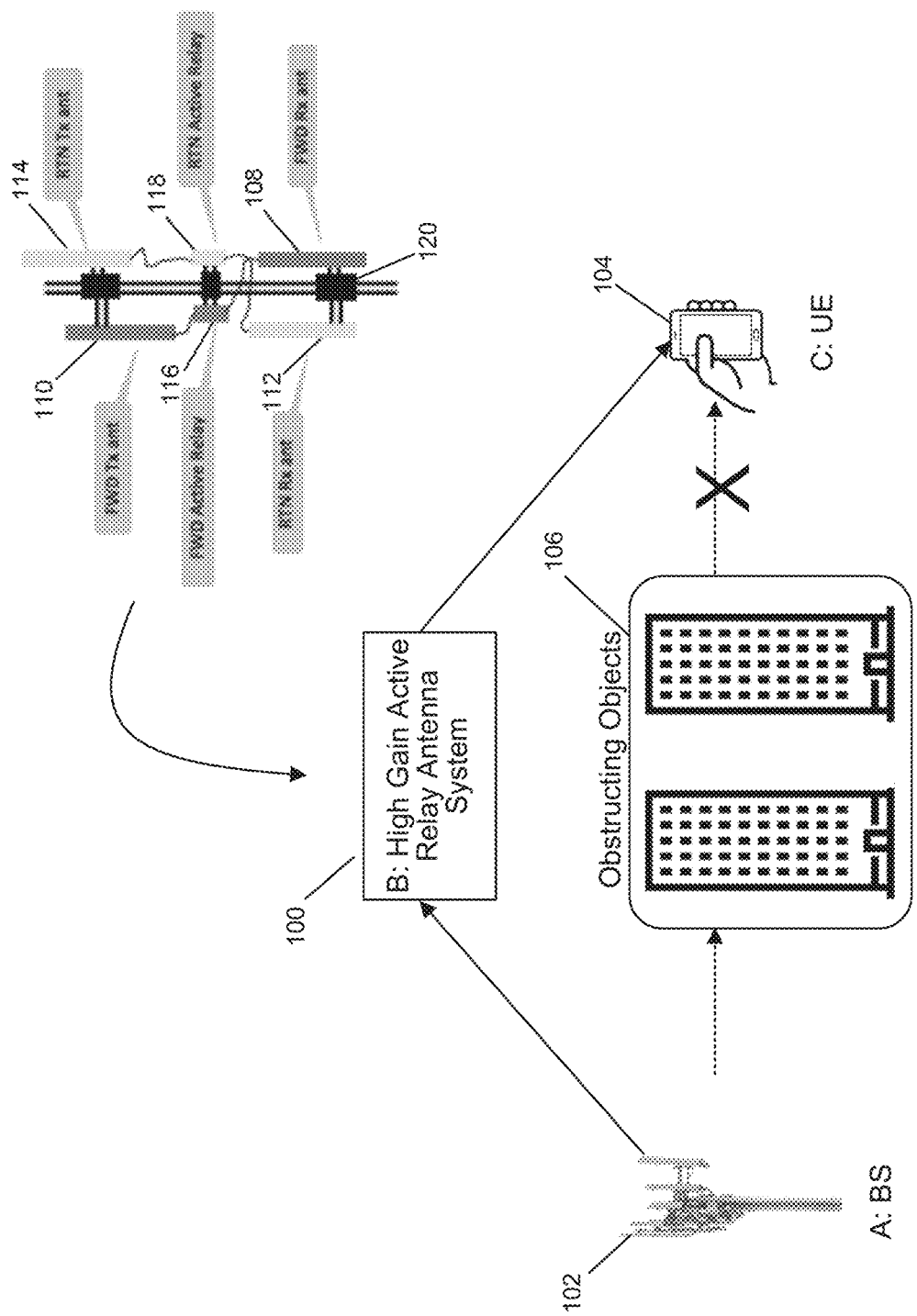
FIG. 1 is a schematic diagram showing a high gain active relay antenna system in an example environment and configuration, according to various implementations of the subject technology.

A high gain active relay antenna system is disclosed. The high gain active relay antenna system is suitable for many different millimeter wave ("mm-wave") applications, and can be deployed in a variety of different environments and configurations. Mm-wave applications are those operating with frequency allocations between 24 GHz and 300 GHz or a portion thereof, including 5G applications in the 24, 26, 28, 39, and 60 GHz range, among others. In various examples, the high gain active relay antenna system provides a high gain amplification of a wireless signal to connect with wireless devices and user equipment ("UE") that are operational in complicated environments, including outdoors with obstructing structures (e.g., skyscrapers, buildings, trees, etc.), and non-line-of-sight areas and indoors with walls and constructs. The high gain active relay antenna system has an active amplification subsystem that is made of amplifiers in several stages, which may include low noise amplifier stages, gain-control attenuators, variable gain amplifier stages, and power amplifier stages.

Optional functionalities, such as filtering, phase shifting, beam-steering, beamforming (e.g., performed by beamforming networks), and matching (e.g., performed by matching networks ("MNs"), which may employ step-adjustable attenuators) may also be implemented. In particular, for relay solutions involving higher layers, such as the Media Access Control ("MAC") layer, network layer processing, analog-to-digital conversion, digital-to-analog conversion, digital channelization filtering, and other physical layer functionalities may also be implemented. Frequency conversion operations in both up-conversion and down-conversion may also be implemented in the high gain active relay antenna system. The main applications supported by the disclosed high gain active relay antenna system include general wireless cellular communication network optimization in various scenarios (e.g., planned or temporary), which may include, for example, range extension of relay links, availability enhancements of radio links in extreme conditions, and all possible solutions for mission critical applications. The high gain active relay antenna system described hereinbelow provides a way for a network operator to provide ubiquitous coverage, and vastly improve coverage, at a low cost. The disclosed system can provide a basis for efficient network planning and optimization solutions in the context of network densification, which is one of the major 5G NR features.

It is appreciated that, in the following description, numerous specific details are set forth to provide a thorough understanding of the examples. However, it is appreciated that the examples may be practiced without limitation to these specific details. In other instances, well-known methods and structures may not be described in detail to avoid unnecessarily obscuring the description of the examples. Also, the examples may be used in combination with each other.

FIG. 1 illustrates a schematic diagram showing a high gain active relay antenna system 100 in an example environment and configuration. High gain active relay antenna system 100, or simply referred to as relay 100 for description purposes, is a robust and low cost relay solution that is positioned as illustrated between a base station ("BS") 102 and user equipment ("UE") 104 to optimize network coverage. Relay 100 can be a fixed or mobile relay positioned in different elements (e.g., buildings, vehicles, lifters, airliners, etc.) across a network environment (e.g., remote areas, underground, off-shore, on the sea, etc.). In various examples, relay 100 can be used for wireless communications from the BS 102 to the UE 104, and vice-versa from the UE 104 to the BS 102. In either scenario, high gain active relay antenna system 100 provides a high gain to compensate for any propagation loss that occurs within the environment, which can be as high as 110 to 130 decibels ("dB") in a 28 GHz 5G network, over a distance of about 150 to 300 meters ("m"), in a line-of-sight ("LOS") area or in a non-line-of-sight ("NLOS") area. The link from the BS 102 to the UE 104 is referred to herein as the forward link ("FWD link"), or "downlink", and involves a backhaul section from the BS 102 to the relay 100, and an access section from the relay 100 to the UE 104. The link from the UE 104 to the BS 102 is referred to herein as the return link ("RTN link") or "uplink", and involves an access section from the UE 104 to the relay 100, and a backhaul section from the relay 100 to the BS 102. Using a different terminology, the radio links between the BS 102 and the relay 100 (i.e. Relay Node "RN")), of the return link or forward link, are referred to as "donor links", and the radio links between the relay 100 and the UE 104, of the return link or forward link, are referred to as the "service links". Note that because the backhaul link (of the backhaul section) between the relay 100 and the BS 102 is a point-to-point link, the relay 100 can be implemented with high gain array antennas for a long distance. Service links are usually point-to-multiple points in a forward direction, and multiple points-to-point in a return direction and, consequently, wide-beam antennas are usually used and the distance is shorter.

As shown with the dotted arrows, the path between the BS 102 and the UE 104 is blocked by obstructing objects 106, which may include an infrastructure(s) (e.g., high rise buildings), vegetation, and so on. The BS 102, the relay 100, and the UE 104 are positioned in a large turning angle ABC ("∠ABC") configuration. The positioning of the relay 100 in this configuration enables the BS 102 to provide wireless coverage to the UE 104 at a high gain and, therefore, achieve the desired performance and wireless experience for the users (i.e. at the UEs (e.g., UE 104)). In various examples, the relay 100 includes two pairs of antennas, which include one antenna pair for the FWD link and another antenna pair for the RTN link. The FWD link antenna pair includes a FWD receive antenna 108 to receive signals transmitted from the BS 102, and a FWD transmit antenna 110 to relay (transmit) the signals to the UE 104 after power amplification of the signals by a FWD link active section 116 of the relay 100. The RTN link antenna pair includes a RTN receive antenna 112 to receive signals transmitted from the UE 104, and a RTN transmit antenna 114 to relay (transmit) the signals to the BS 102 after power amplification of the signals by a RTN link active section 118 of the relay 100. The antennas transmitting and receiving signals between the relay 100 and the UE 104 (i.e. the FWD transmit antenna 110 and the RTN receive antenna 112) are referred to as "access link antennas". And, the antennas transmitting and receiving signals between the relay 100 and the BS 102 (i.e. the FWD receive antenna 108 and the RTN transmit antenna 114) are referred to as "backhaul link antennas".

An active relay is located between each pair of relay antennas (e.g., a FWD active relay 116 is located between the FWD receive antenna 108 and the FWD transmit antenna 110, and a RTN active relay 118 is located between the RTN receive antenna 112 and the RTN transmit antenna 114). The active relays (i.e. FWD active relay 116 and RTN active relay 118) are designed to provide a high power gain, which boosts a weak signal plagued by propagation loss from the receive antenna (i.e. FWD receive antenna 108 and RTN receive antenna 112) to a specific gain level to drive the transmit antenna (i.e. FWD transmit antenna 110 and RTN transmit antenna 114). The relay 100 also includes support mounts, such as mount 120, to serve as support members for the antennas (i.e. FWD transmit antenna 110, RTN transmit antenna 114, FWD receive antenna 108, and RTN receive antenna 112) and the active relays (i.e. FWD active relay 116 and RTN active relay 118) of the relay 100. In should be noted that, in one or more examples, the relay 100 may comprise more than two pairs of antennas as is shown in FIG. 1. For example, the relay 100 may comprise two pairs of FWD antennas (with an active relay located between each pair of antennas) and two pairs of RTN antennas (with an active relay located between each pair of antennas), as opposed to only one pair of FWD antennas (i.e. FWD receive antenna 108 and FWD transmit antenna 110) and one pair of RTN antennas (i.e. RTN receive antenna 112 and RTN transmit antenna 114) as is depicted in FIG. 1.

It is appreciated that the proposed architecture of the relay 100 with two antenna pairs and one active relay between the receive and transmit antennas of each antenna pair is particularly suitable for millimeter wave relay applications, where the backhaul link is typically a point-to-point link and the access link is a point-to-multipoint link. Further, the architecture of the relay 100 allows for a separation between the access link antennas (i.e. the FWD transmit antenna 110 and the RTN receive antenna 112) and the backhaul link antennas (i.e. the FWD receive antenna 108 and the RTN transmit antenna 114) so that they are optimized in an independent way without any constraint from each other (e.g., the access link antennas may be designed for a wide and/or shaped coverage area to provide optimized connectivity with UE(s) (e.g., UE 104), while the backhaul link antennas can be implemented with high directivity designs with narrow beams to compensate for the high path loss in the millimeter wave band), thereby alleviating the interference caused by other cells within the network. The backhaul link antennas can be optimally pointed to the BS(s) (e.g., BS 102), and the access link antennas can be pointed to the coverage area of the UE(s) (e.g., UE 104) at the best orientation angle.

Note that for an access link antenna, its gain is reduced when it is designed to cover a wide area with a wide beam. In such circumstances, the coverage area will not be large with the limited beamforming gain for these types of access link antennas. The access link antennas can be designed to form shaped beams (e.g., beams with specific shapes to cover an area in which most of the subareas are covered and some of the areas can be masked without signals reached). This is a unique feature of the disclosed two-antenna architecture for the relay 100. Also note that an active solution becomes necessary, and even indispensable, in millimeter wave wireless applications. The power amplification functionality provided by the active relays (e.g., FWD active relay 116 and RTN active relay 118) enables a power gain from some tens of dB up to over hundreds of dB to boost the relayed signal in both the downlink and uplink signals, thereby meeting the connectivity requirements in the access links.

Figure 2:
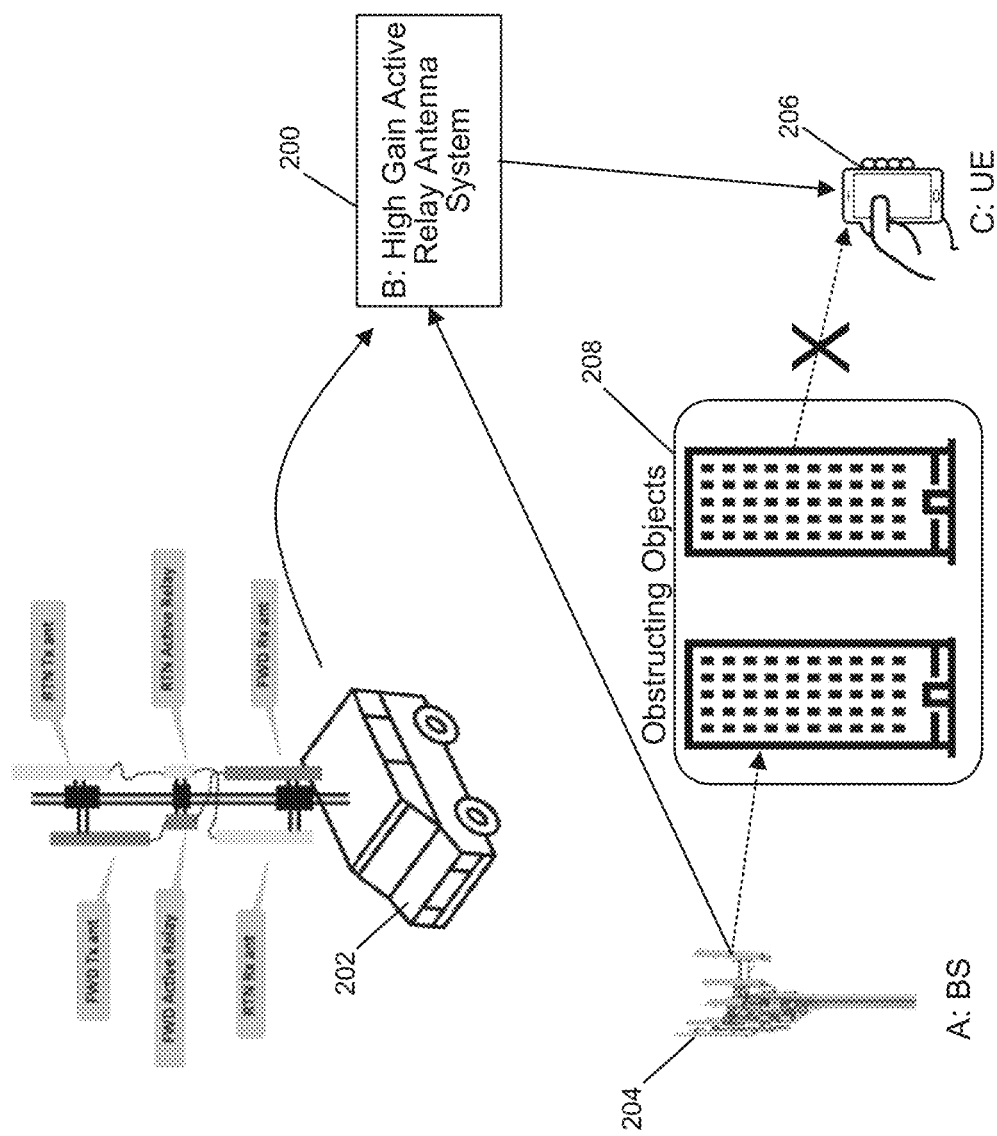
FIG. 2 is a schematic diagram showing a high gain active relay antenna system in another example environment and configuration, according to various implementations of the subject technology.

In one example, illustrated in FIG. 2, a high gain active relay antenna system 200 is mounted on a mobile vehicle 202 between a BS 204 and a UE 206. As shown with the dotted arrows, the path between the BS 204 and the UE 206 is blocked by obstructing objects 208, which may include an infrastructure(s) (e.g., high rise buildings), vegetation, and so on. The BS 204, the relay 200 and the UE 206 are positioned in a turning angle ∠ABC configuration. The positioning of the relay 200 on the vehicle 202 in this configuration enables the BS 204 to provide wireless coverage to the UE 206 at a high gain and, therefore, achieve the desired performance and wireless experience for the users (i.e. at the UEs (e.g., UE 206)).

Figure 3:
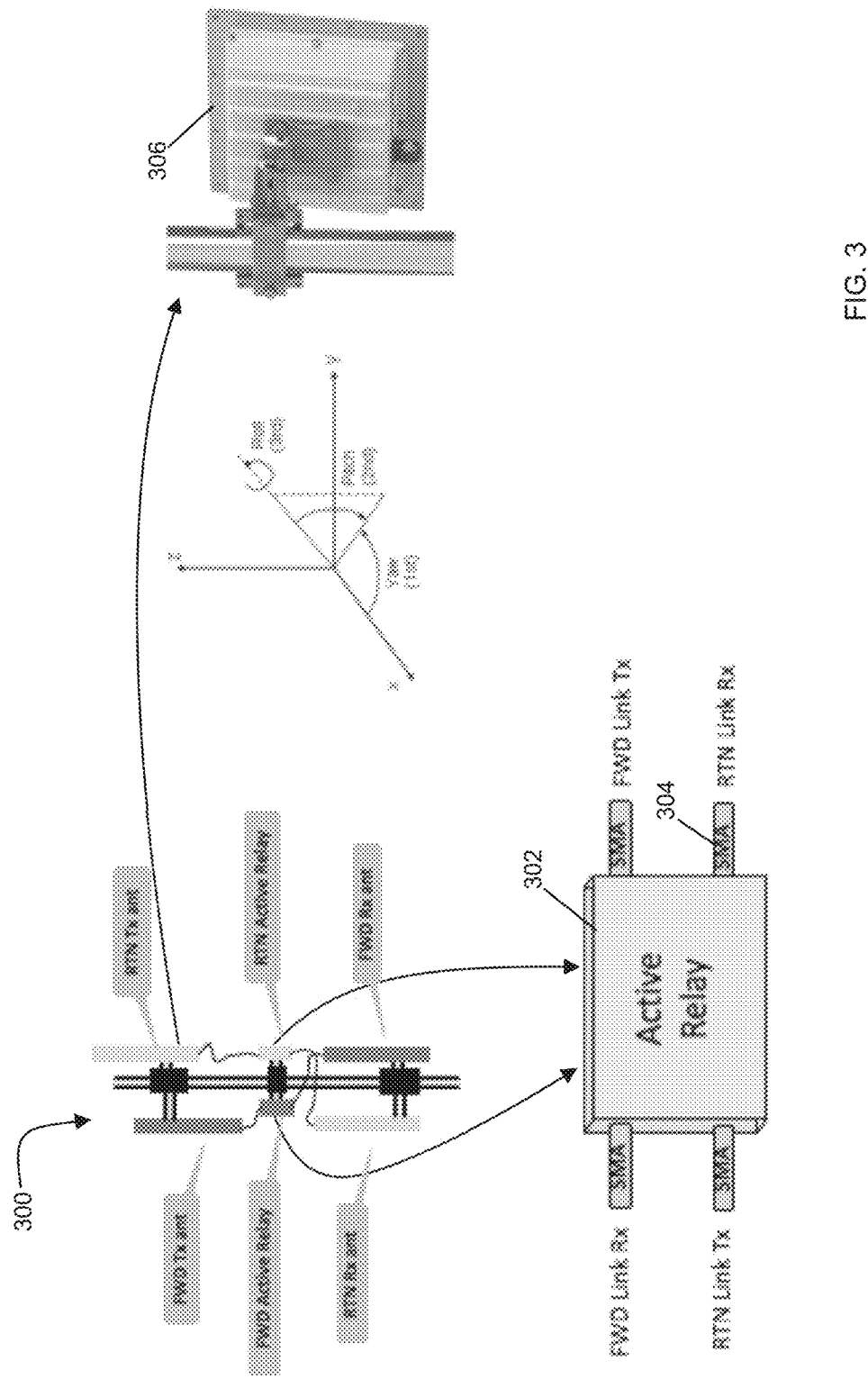
FIG. 3 is a schematic diagram of a high gain active relay antenna system and example implementations of its antennas and active relays, according to various implementations of the subject technology.

Attention is now directed at FIG. 3, which shows a schematic diagram of a high gain active relay antenna system 300 and example implementations of its antennas and active relays. The high gain active relay antenna system 300, or simply referred to as the relay 300, is implemented as described above with reference to FIGS. 1 and 2. Relay 300 can either be fixed in an infrastructure (e.g., a building, wall, etc.) or mobile as mounted on a mobile vehicle. In either configuration, the relay 300 includes two pairs of antennas, one pair for the FWD link and another pair for the RTN link. Each antenna pair has an active relay to provide a high power gain for the wireless signal received at the receive antenna to drive the transmit antenna. An example implementation of an active relay is active relay 302, which as described in more detail below, is implemented with a modular analog signal processing and amplification architecture that may be designed to be suited for different relay applications where various trade-offs are possible between antennas and radios. The disclosed active relay 302 includes a plurality of connectors (e.g., coaxial connector 304) for connecting each of the antennas of the antenna pairs to the relay 300. Various different types of connectors may be employed for the connectors including, but not limited to, SubMiniature version A ("SMA") connectors.

The antennas in the relay 300 may be array antennas designed for a specific application, environment (e.g., a city environment, a rural environment, etc.), and/or associated conditions (e.g., weather, population, etc.). In various examples, the antennas can be manufactured from metastructures, which are specially designed structures that manipulate electromagnetic signals to suite various applications. More specifically, metastructures are engineered, non- or semi-periodic structures that are spatially distributed to meet a specific phase and frequency distribution. A metastructure antenna can be designed with metastructure reflector elements that are very small relative to the wavelength of the wireless signals. The metastructure antennas are able to generate directed, narrow beams to improve wireless communications between UE and a BS serving the UE in a wireless network.

Each antenna can be made to be three-dimensionally ("3D") maneuverable in roll, pitch, and yaw by using a suitable mechanical structure, such as illustrated with antenna 306 (e.g., a phased array antenna) in FIG. 3. Note that the yaw rotation adjusts the antenna in azimuth, the pitch rotation adjusts the antenna in elevation, and the roll rotation can be used to adjust the antenna to operate at a specific linear polarization (i.e. horizontal and/or vertical polarization). The maneuverable design allows for the backhaul link antennas (i.e. the FWD receive antenna and the RTN transmit antenna) of the relay 300 to be pointed to the BS, and for the access link antennas (i.e. the FWD transmit antenna and the RTN receive antenna) of the relay 300 to be pointed to cover areas of different shapes and ranges with wide beams, while avoiding interferences. Compared to metallic parabolic antennas, phased array antennas, such as antenna 306, do not employ separate feed structures and, as such, are lighter and provide for better aerodynamics. In one or more examples, the feed network for antenna 306 is embedded in a phased array printed circuit board ("PCB").

Figure 4:
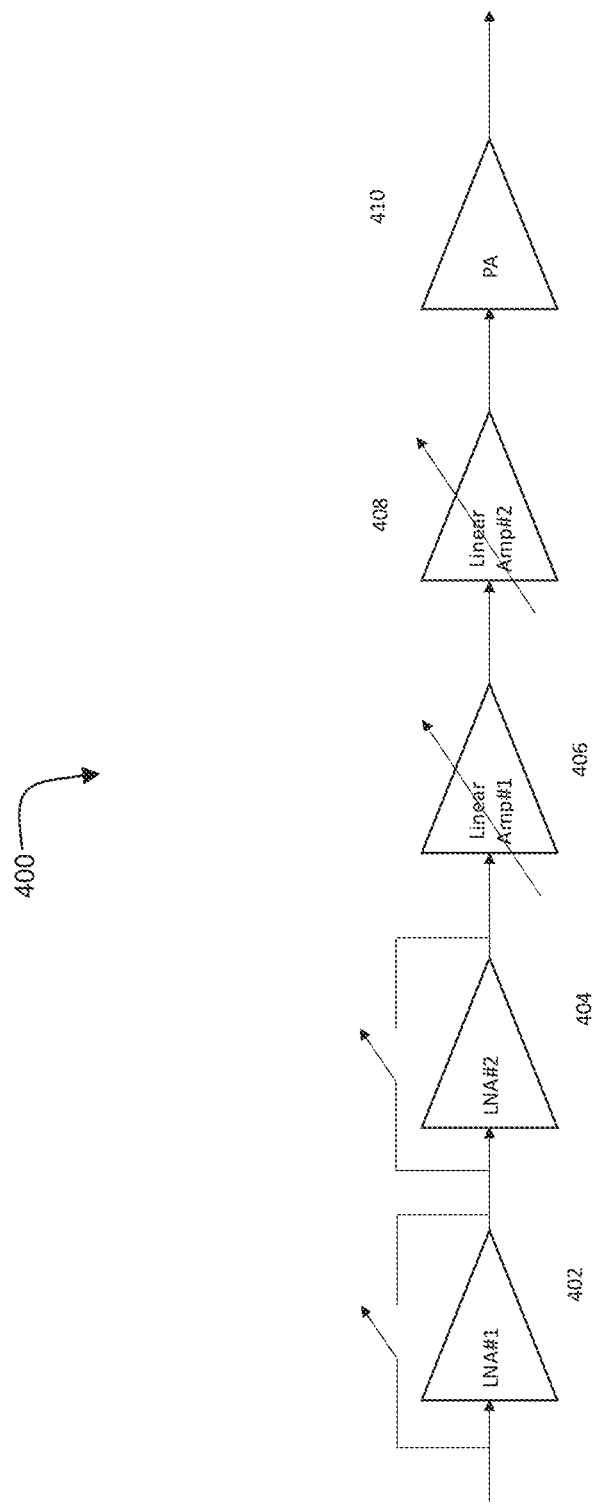
FIG. 4 is a schematic diagram of an active relay for use in a high gain active relay antenna system, according to various implementations of the subject technology.

FIG. 4 illustrates an example implementation of an active relay 400 for use in a high gain active relay antenna system. The active relay 400 includes wideband stages, without passband filtering, because it is assumed that the use of phased array antennas can provide frequency selectivity. The stages in the active relay 400 include a low-noise amplifier ("LNA") stage having two LNAs (comprising LNA 402 and LNA 404) (used for amplifying the received signals without significantly degrading the signal-to-noise ratio), both of which are by-passable with a switch; a first linear amplifier ("LA") stage (comprising LA 406) and a second LA stage (comprising LA 408) (used for adjusting the signals to a desired input power level for the PA), both of which have a gain regulation feature; and a power amplifier ("PA") stage (comprising PA 410) (used for amplifying the signals for transmission). These amplification stages 402, 404, 406, 408, 410 are able to generate an adjustable power gain to boost wireless signals in a 5G wireless network and improve the overall coverage and network performance to the network users. It should be noted that, in one or more examples, the LNA stage of the active relay 400 may comprise a greater or fewer number of LNAs than as shown in FIG. 4. In addition, the active relay 400 may comprise a greater or fewer number of LA stages, and/or a greater number of PA stages than as shown in FIG. 4.

Figure 5:
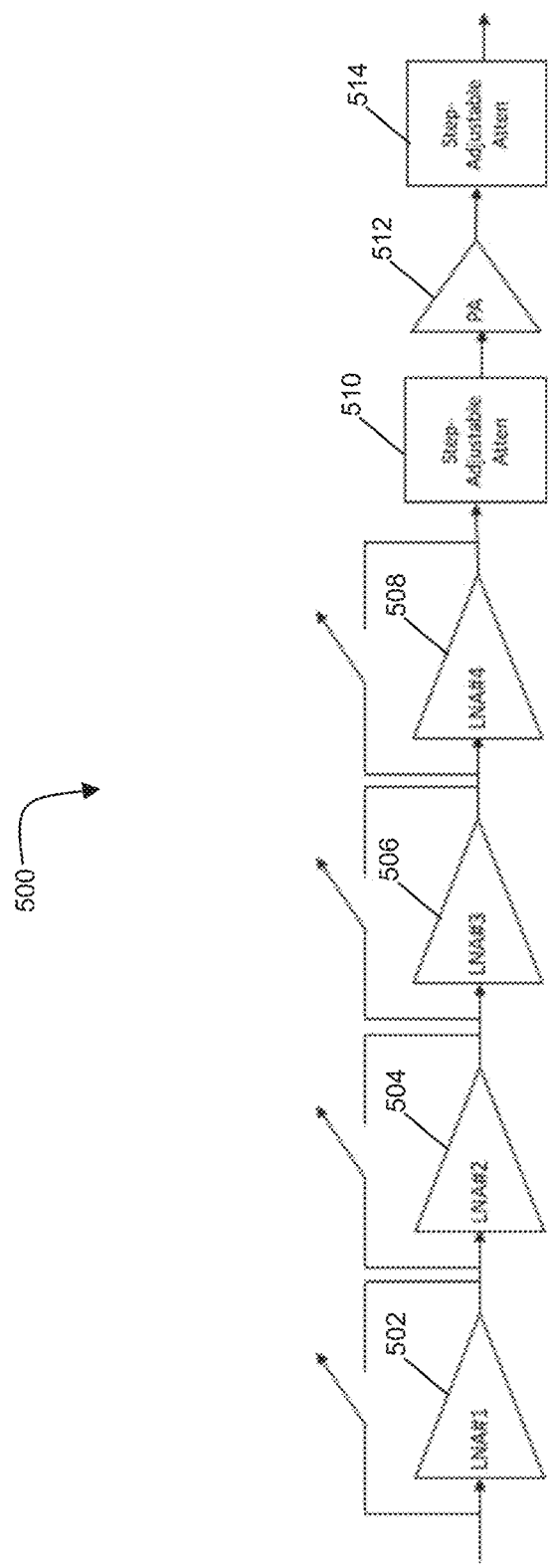
FIG. 5 is a schematic diagram of another active relay for use in a high gain active relay antenna system, according to various implementations of the subject technology.

Another example implementation of an active relay architecture is shown in FIG. 5, which shows an active relay architecture 500 that may be suitable for both transmit and receive antennas. The active relay architecture 500 includes an LNA stage comprising switchable LNAs 502, 504, 506, 508 (used to amplify the received signals without significantly degrading the signal-to-noise ratio), a first step-adjustable attenuation stage 510 (used to adjust the signals to a desired input power level for the PA), a PA stage 512 (used to amplify the signals for transmission), and a second step-adjustable attenuation stage 514 (used for impedance matching the signals with the transmit antenna). Similar to active relay architecture 400 in FIG. 4, active relay architecture 500 also provides an adjustable power gain to boost wireless signals and optimize the performance in a 5G wireless network. In one or more examples, the LNA stage of the active relay architecture 500 may comprise a greater or fewer number of LNAs than as shown in FIG. 5. In addition, the active relay architecture 500 may comprise a greater number of PA stages than as shown in FIG. 5. Also, the active relay architecture 500 may or may not comprise the first step-adjustable attenuation stage 510 and/or the second step-adjustable attenuation stage 514 as is shown in FIG. 5.

These various stages can be implemented with radio frequency ("RF") amplifier parts designed for high performance and low cost for millimeter wave bands, including 28 GHz and 60 GHz. Using such an active signal processing architecture, requirements on array antennas and their associated mechanical supporting devices are relaxed and simplified. In certain circumstances, for example, for deployments in remote windy sites, array antennas with compact form factors could be more advantageous to employ than a larger array antenna. In considering the installation, maintenance, and system reliability, the proposed solutions employing compact array antennas would be preferable over the use of large array antennas.

As modularity is another feature that the example implementation addresses with considerations in system architecture, the proposed system configurations are based on semi-opened modules, separating the receive and transmit antennas, thereby allowing the insertion of filtering, frequency conversion, and digital signal generation and processing. The proposed modular subsystems are provided with interfaces for a digital control and bus with register access, an autonomous power supply, and possibly wireless modules with remote connectivity for system configuration, calibration, monitoring, and updating.

In particular, another example implementation is to split the active relay architecture into two separate functionalities, which are provided by a separate receive architecture and transmit architecture, as is shown in FIGS. 6A, 6B, and 6C. In particular, FIG. 6A shows the receive architecture 600, FIG. 6B shows the transmit architecture 602, and FIG. 6C shows the combination architecture 604 comprising the receive architecture 600 of FIG. 6A combined with the transmit architecture 602 of FIG. 6B along with additional optional functionalities. Several advantages of this architectural arrangement are that the architecture allows for more flexible implementations and applications. One of the advantages of the architecture is in design consideration, where the transmit architecture 602 (comprising a second LA stage and a PA) is designed with thermal precautions as it works in a higher regime of power handling, whereas the receive architecture 600 (having an LNA stage comprising two switchable LNAs, and a first LA stage) is designed in a small signal regime and, thus, a low noise design methodology is applied. A further advantage of the architecture is that the transmit architecture 602 provides for high flexibility to meet various different system level requirements for different applications. For example, frequency filtering and converting, digital processing, L2 switching, L3 routing, and/or etc. can all be accommodated as depicted by the functional block located between the receive and transmit antennas, as shown in architecture 604 of FIG. 6C.

In other system configurations, beam steering can be supported and the proposed solutions consist of phase shifters and feed networks in the front-end configurations. One of the proposed features is automatic gain control ("AGC") capability based on assessments of the link status, such as, for example, received signal strength indicator ("RSSI") or more collaborated system procedures including link quality monitoring and control functions. The AGC function is also separated and distributed to separate transmit and receive sections, so that the FWD link and RTN links are controlled and maintained independently.

Figure 7:
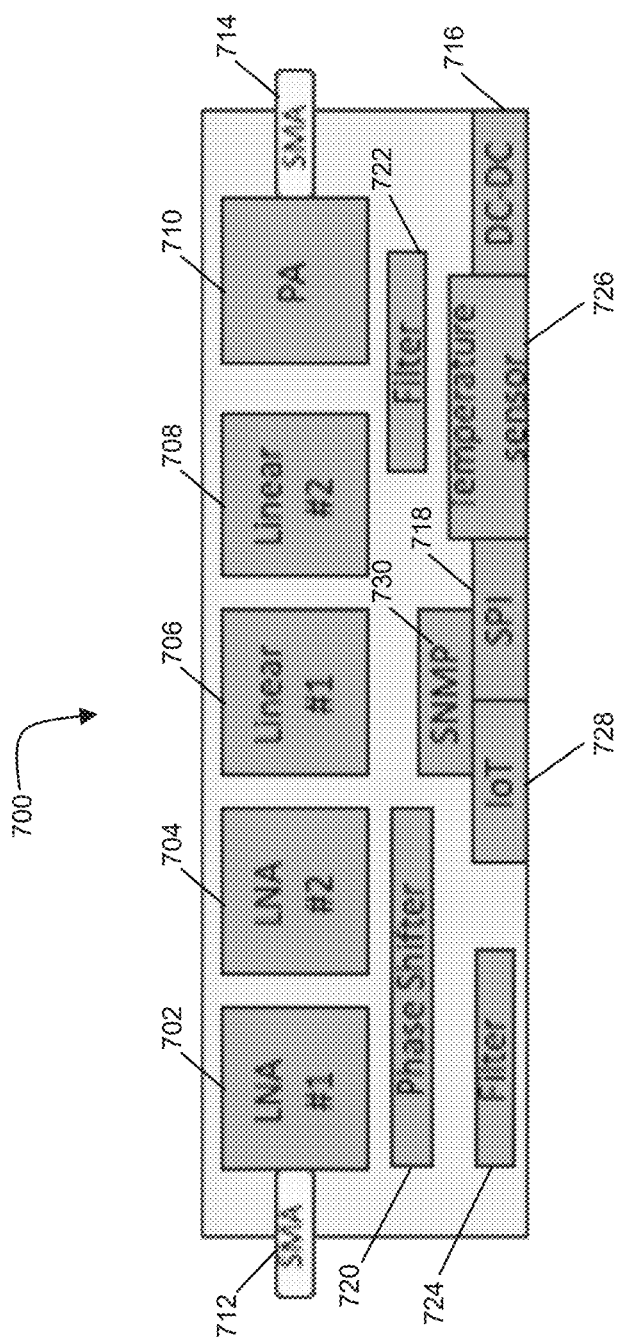
FIG. 7 illustrates an active relay circuit implementation, according to various implementations of the subject technology.

Attention is now directed to FIG. 7, which illustrates an active relay circuit 700 implementation in accordance with various examples. The active relay circuit 700 comprises a plurality of active relay stages 702, 704, 706, 708, 710 (similar to the implementation of FIG. 4) located between two coaxial connectors 712, 714 (e.g., SMA connectors). The active relay circuit 700 may also include other circuit components for a flexible configuration suitable for different 5G applications at different frequency bands, such as at 28 GHz and others. Optionally included in the active relay circuit 700 are an autonomous direct current ("DC") power supply 716, an external digital control interface, such as a serial peripheral interface ("SPI") bus 718, a phase shifter 720, filters 722 and 724, a temperature sensor 726, and/or an Internet of Things ("IoT") transceiver 728 connected in parallel with the SPI bus 718, both of which using a simple network management protocol ("SNMP") unit 730 for operation, administration and maintenance ("OAM") purposes. The SPI interface may be used with an external multipoint control unit ("MCU"). A suitable IoT solution supports OAM functions wirelessly, and in particular, these functions may include powering on/off, reconfiguring, status monitoring, alarming, reporting, as well as billing. These functions can all be provided via either an SPI interface or an IoT interface, or both for redundancy. Additional circuit components may be included in the active relay circuit 700 architecture as desired to boost the gain from a receive antenna to a transmit antenna. In various examples, the transmit and receive antennas coupled to an active relay, such as the active relay circuit 700, may be optimally and separately designed as per the coverage requirements. A beamforming antenna design, for example, may be implemented and used in 5G applications without constraints, while achieving both high performance and low cost. The active relay circuit 700 provides an adjustable power gain, so that active relay solutions can be applied universally to almost any wireless communications scenario, both indoors and outdoors. Further, in active relay solutions with separate antennas and transceivers, interference is mitigated, and sophisticated time division duplexing ("TDD") is not necessary.

Figure 8:
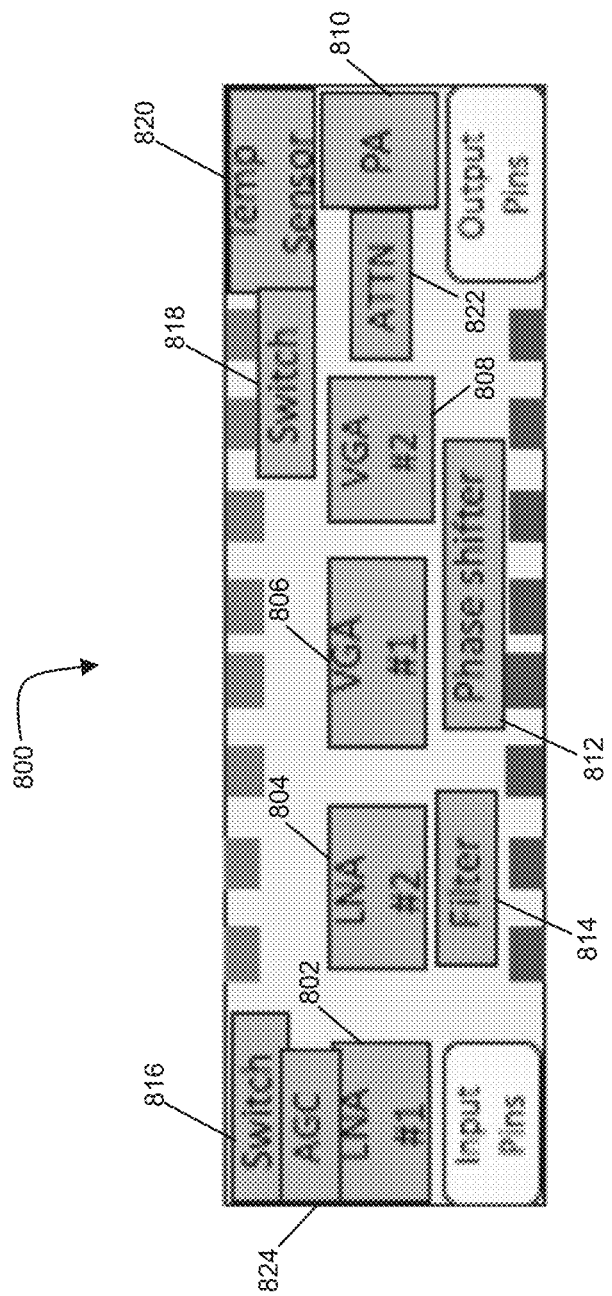
FIG. 8 illustrates another active relay circuit implementation, according to various implementations of the subject technology.

Another example active relay circuit implementation is illustrated in FIG. 8. The active relay circuit 800 is designed with integrated LNAs 802 and 804, and variable gain amplifiers ("VGAs") 806 and 808. These VGAs 806 and 808, in addition to other LAs and PAs (e.g., PA 810), may be integrated into a single monolithic microwave integrated circuit ("MMIC") for scalability. Additional components, such as a phase shifter 812 for beam steering, a filter 814 for filtering, switches 816 and 818, a temperature sensor 820, an attenuator 822, an AGC 824, mixers (not shown) for up and down frequency conversion, and/or so on, may be included in the active relay circuit 800. Additional functionalities may be provided by the implementation of various additional components, such as signal interfaces having both differential or single-ended options, a SPI slave transceiver, an IoT radio transceiver (for control, alarm, and update), a power supply, clocks, and/or other protection and testing/monitoring components (e.g., a simple network management protocol version 2 ("SNMPv2") unit, and/or a simple network management protocol version 3 ("SNMPv3") unit) operating over the SPI or IoT that may be external and operating via dedicated pins. IoT solutions may be implemented by any commercial off-the-shelf solutions, including, for example, Wi-Fi, Zigbee, and so on.

Figure 9:
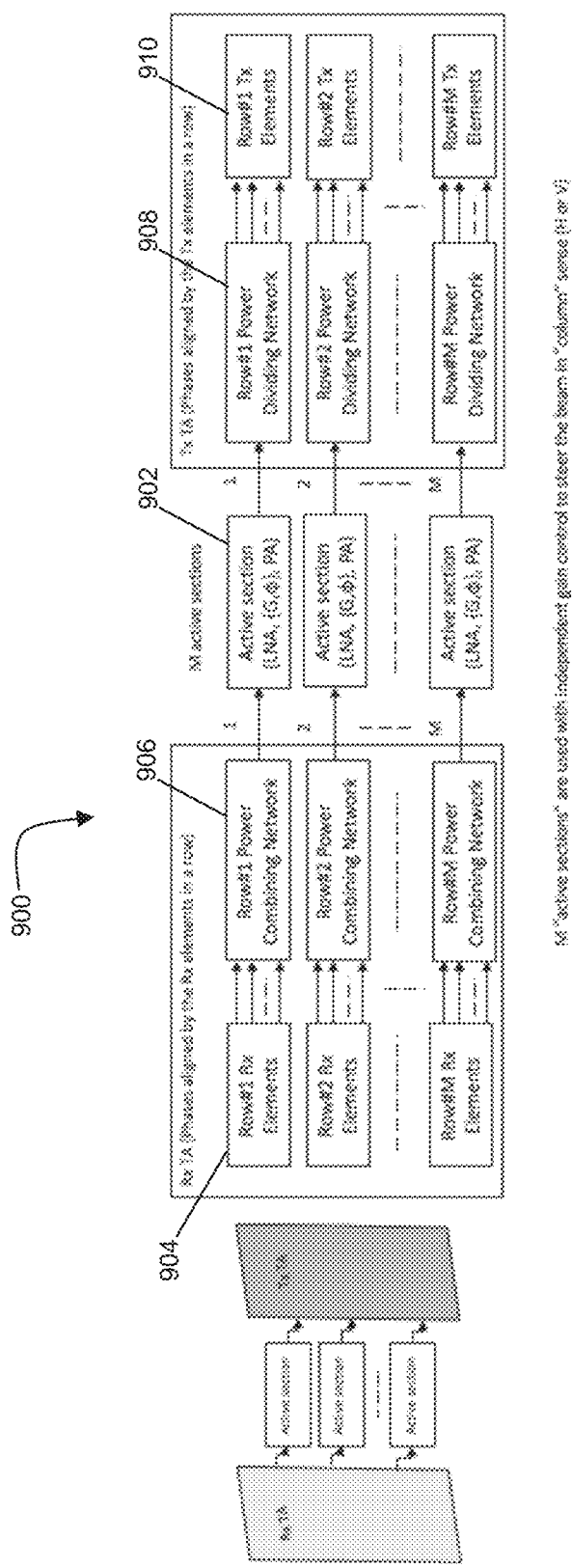
FIG. 9 illustrates an example active relay architecture for use in various applications, according to various implementations of the subject technology.

The active relay architectures described herein may be applied to various use cases with various system level solutions. Example solutions may include the feature of partial power combining and dividing (for beamforming and steering) that supports active relay solutions based on sub-array configurations, active power bootstrapping with separate reflect array ("RA") antennas, active relay solutions for both frequency division duplexing ("FDD") and TDD operations, and many others. An example solution is illustrated in FIG. 9, where a partial power dividing network 908 and a partial power combining network 906 are employed to realize better design trade-offs. In particular, the active relay architecture 900 employs an L×M receive array (i.e. phased array receive antenna 904) and an L×M transmit array (i.e. phased array transmit antenna 910), wherein L is the number of the array elements in each row, and M is the number of the columns. This active relay architecture 900 provides beamforming in one of the dimensions (either in azimuth or in elevation), where, for example M number of beams are formed in azimuth and beam-steering can be performed for each beam such that the beam-steering is controlled by the active relay sections 902. In one or more embodiments, the active relay sections 902 align a plurality of phases at the plurality of receive antenna elements of the phased array receive antenna 904 with a plurality of phases at the plurality of transmit antenna elements of the phased array transmit antenna 910. These active relay sections 902 are implemented in the active relay architecture 900 to drive the transmission signals from the phased array receive antenna 904 to the partial power combining network 906, to the partial power dividing network 908, and ultimately to the phased array transmit antenna 910. The receive section (comprising the phased array receive antenna 904 and the partial power combining network 906) and the transmit section (comprising the partial power dividing network 908 and the phased array transmit antenna 910) of the active relay architecture 900 are independently designed according to the receive angle space specification and the transmit angle space specification, respectively, which are not necessarily identical.

Another example supported by the active relay architecture 900 is for high gain applications using phased arrays, where the number of elements can be very large. For these applications, a "one-element-one-PA" configuration could be very difficult to implement and, in addition, the DC power consumption could be prohibitive. In cases where the phases at all of the elements are aligned, the signals received at various elements can be combined with power combiners. Once the signals are amplified by the PAs by the active relay sections 902, these amplified signals can be combined, divided, and redistributed for transmission. The active relay architecture 900 is scalable and adaptable to both variable and fixed scenarios for the phase alignments between the two independent receive and transmit phased arrays. A particular feature of the active relay architecture 900 is that it supports from one beam up to M number of beams, and the transmit beamforming operations are realized in space. Almost any 5G relay scenario can be supported with this universal architecture configuration for highly flexible and active relay solutions with trade-offs performed between antenna cost and coverage performance.

Figure 10:
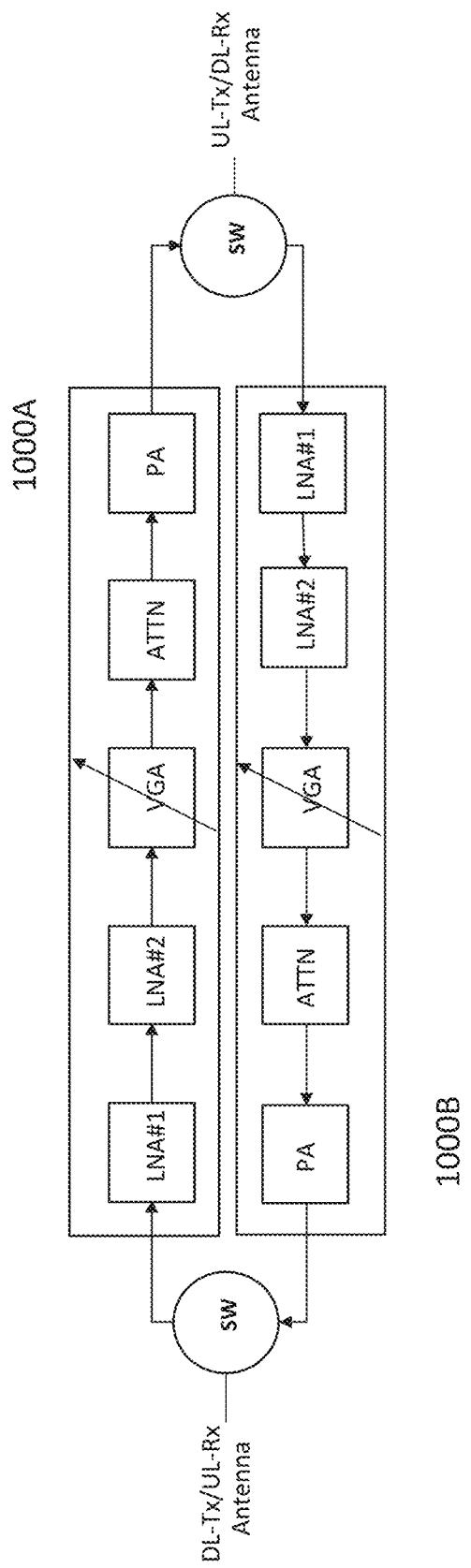
FIG. 10 illustrates an active relay for use with the active relay architecture of FIG. 9, according to various implementations of the subject technology.

FIG. 10 illustrates an example active relay for use with the active relay architecture of FIG. 9. This active relay configuration may be used with two antennas (e.g., a downlink-transmit/uplink-receive ("DL-TX/UL-Rx") antenna and an uplink-transmit/downlink-receive ("UL-Tx/DL-Rx")). The active portion of the active relay is composed of input lines (e.g., coaxial cables), LNAs for amplifying the received signals without significantly degrading the signal-to-noise ratio, VGAs (with an adjustable gain) for amplifying the signals, step-adjustable attenuators ("ATTNs") for adjusting the signals to a desired input power level for the PAs, PAs for amplifying the signals for transmission, and post lines (e.g., coaxial cables). The two active sections 1000A and 1000B are combined by two switches ("SWs"), which may be utilized for TDD full-duplex operation (e.g., for time-duplexing switching) for the active relay. In one or more examples, the active sections 1000A and 1000B may be implemented as a single subsystem or, alternatively, as a separate device for flexible use in a relay antenna system using suitable connections, including cables. It should be noted that in one or more examples, the active relay of FIG. 10 may comprise more or less input lines, LNAs (which may be switchable), VGAs, ATTNs, PAs, post lines, SWs, and/or antennas than as shown in FIG. 10. In addition, in some examples, the active relay of FIG. 10 may comprise at least one LA (which may have a gain regulation feature) as is shown in FIG. 4.

Figure 11:
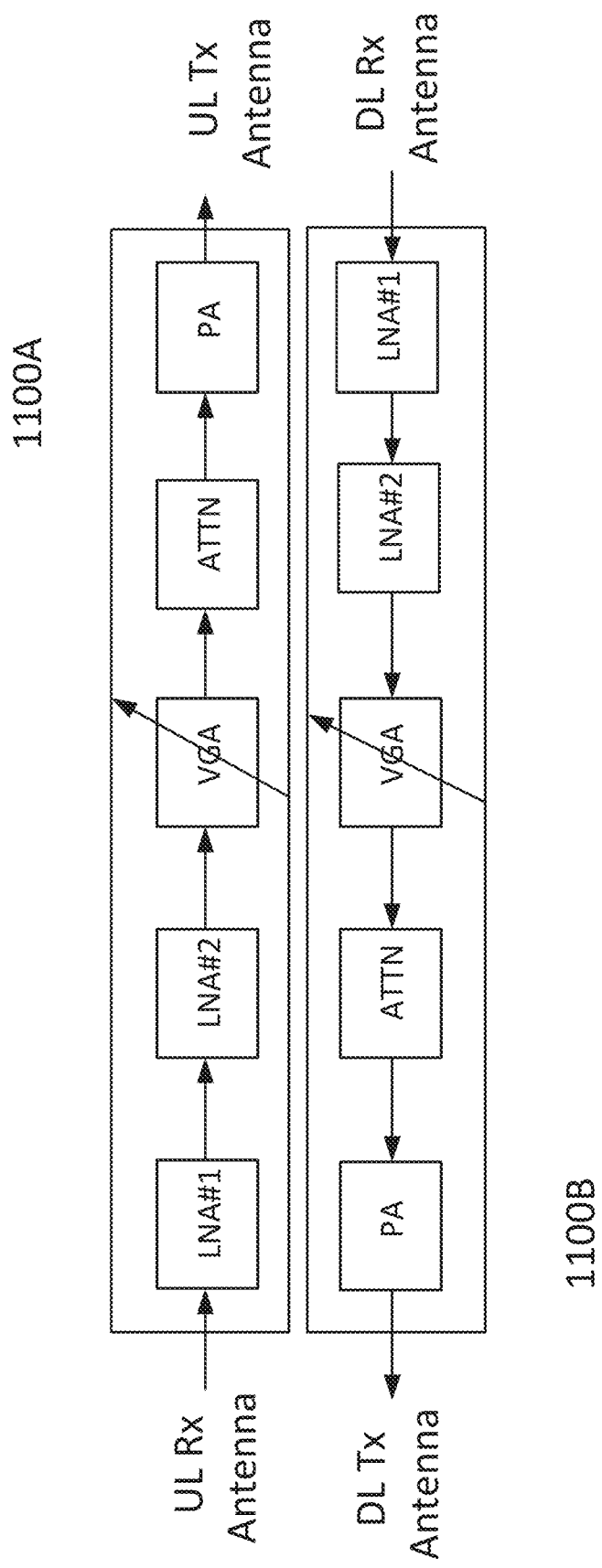
FIG. 11 illustrates an active relay, in a different configuration, for use with the active relay architecture of FIG. 9, comprising two separate and isolated signal paths without employing time-duplexing switches, which may be employed by the active relay systems of FIGS. 1, 2, and 3, according to various implementations of the subject technology.

FIG. 11 illustrates another example active relay for use with the active relay architecture of FIG. 9. This active relay configuration may be used with four antennas (e.g., an uplink receive ("UL Rx") antenna, a downlink transmit ("DL Tx") antenna, an uplink transmit ("UL Tx") antenna, and a downlink receive ("DL Rx") antenna) for use with the dynamic TDD schemes adopted in 5G NR. The active portion of the active relay is composed of input lines (e.g., coaxial cables), LNAs for amplifying the received signals without significantly degrading the signal-to-noise ratio, VGAs (with an adjustable gain) for amplifying the signals, ATTNs for adjusting the signals to a desired input power level for the PAs, PAs for amplifying the signals for transmission, and post lines (e.g., coaxial cables). The two active sections 1100A and 1100B can be used for TDD full-duplex operation. The active section of the active relay can be implemented as a single subsystem or, alternatively, as a separate device for a flexible use in a relay antenna system, using suitable connections including cables. There are several important features of this alternative architecture for a TDD active relay. The first important feature is that the proposed architecture can easily accommodate the "dynamic TDD" operation adopted by 5G NR standard. And, the second important feature is the proposed active relay system can operate with timing transparency (i.e., since the system employs two separate, isolated signal paths, the system does not need to be timing synchronized (which requires a high level of accuracy) for TDD operation and, as such, no TDD switches are needed). These considerable advantages are at the expense of using four antennas instead of only two antennas (e.g., refer to the active relay of FIG. 10, which employs two antennas, but requires the use of TDD switches for time-duplexing switching). It should be noted that in one or more examples, the active relay of FIG. 11 may comprise more or less input lines, LNAs, VGAs, ATTNs, PAs, post lines, and/or antennas than as shown in FIG. 11. In addition, in some examples, the active relay of FIG. 11 may comprise at least one LA (which may have a gain regulation feature) as is shown in FIG. 4.

Figure 12:
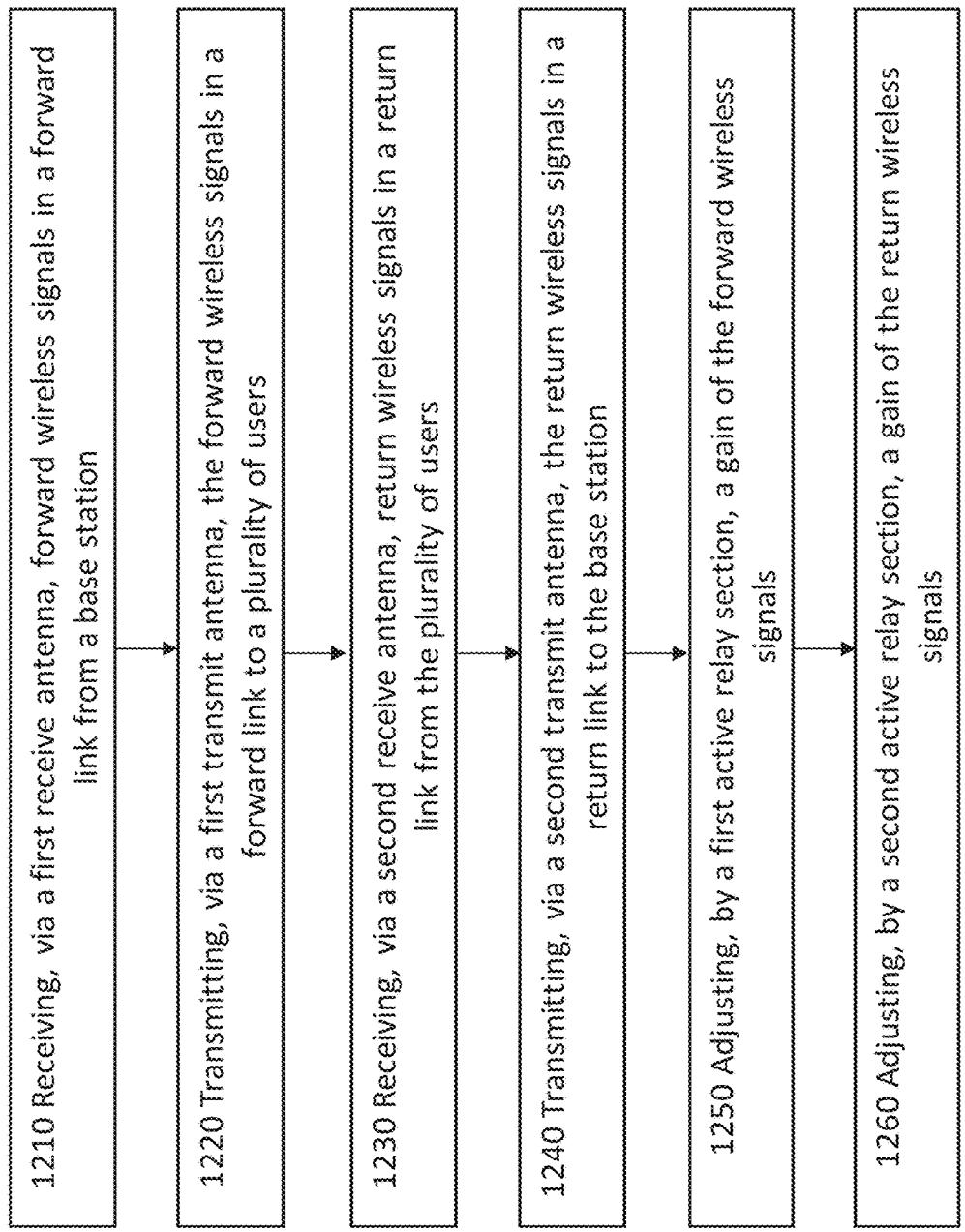
FIG. 12 illustrates a flow chart for the disclosed method for operation of a high gain active relay antenna system, according to various implementations of the subject technology.

FIG. 12 illustrates a flow chart for the disclosed method 1200 for operation of a high gain active relay antenna system, according to various implementations of the subject technology. At the start of the method 1200, forward wireless signals are received via a first receive antenna in a forward link from a base station, 1210. Then, the forward wireless signals are transmitted via a first transmit antenna in the forward link to a plurality of users, 1220. Also, return wireless signals are received via a second receive antenna in a return link from the plurality of users, 1230. The return wireless signals are then transmitted via a second transmit antenna in the return link to the base station, 1240. Then, a first active relay section adjusts a gain of the forward wireless signals, 1250. Also, a second active relay section adjusts a gain of the return wireless signals, 1260. Then, the method 1200 ends. In one or more examples, the first active relay section is coupled between the first receive antenna and the first transmit antenna, and the second active relay is coupled between the second receive antenna and the second transmit antenna.

It is appreciated that the previous description of the disclosed examples is provided to enable any person skilled in the art to make or use the present disclosure. Various modifications to these examples will be readily apparent to those skilled in the art, and the generic principles defined herein may be applied to other examples without departing from the spirit or scope of the disclosure. Thus, the present disclosure is not intended to be limited to the examples shown herein but is to be accorded the widest scope consistent with the principles and novel features disclosed herein.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more steps or less steps of the methods may be performed. Accordingly, examples are intended to exemplify alternatives, modifications, and equivalents that may fall within the scope of the claims.

What is claimed is:

1. A high gain active relay antenna system, comprising:
a first antenna pair having a first receive antenna and a first transmit antenna configured to communicate first wireless signals in a forward link from a base station to a plurality of users;
a second antenna pair having a second receive antenna and a second transmit antenna configured to communicate second wireless signals in a return link from the plurality of users to the base station,
wherein the first and second antenna pairs each comprise phased array antennas; and
a first active relay section and a second active relay section configured to provide an adjustable power gain in the first and second wireless signals,
wherein the first active relay section is coupled between the first receive antenna and the first transmit antenna, and the second active relay is coupled between the second receive antenna and the second transmit antenna, and
wherein the first active relay section and the second active relay section each comprise a phase shifter configured for beam steering of the phased array antennas.

2. The high gain active relay antenna system of claim 1, wherein the first and second antenna pairs each comprise metastructure-based antennas.

3. The high gain active relay antenna system of claim 1, wherein the first and the second active relay sections each further comprise a series of amplification stages.

4. The high gain active relay antenna system of claim 3, wherein at least one of the series of amplification stages comprises a power amplifier stage.

5. The high gain active relay antenna system of claim 3, wherein at least one of the series of amplification stages comprises a low noise amplifier stage.

6. The high gain active relay antenna system of claim 3, wherein at least one of the series of amplification stages comprises a linear amplifier stage.

7. The high gain active relay antenna system of claim 3, wherein at least one of the series of the amplification stages comprises a step-adjustable attenuation stage.

8. The high gain active relay antenna system of claim 1, wherein each of the first and second active relay sections further comprises a digital control interface.

9. The high gain active relay antenna system of claim 1, further comprising:
an automated gain control configured for independently controlling and maintaining the forward link and the return link.

10. A high gain active relay antenna system, comprising:
a phased array receive antenna comprising a plurality of receive antenna elements;
a power combining network coupled to the phased array receive antenna;
a phased array transmit antenna comprising a plurality of transmit antenna elements;
a power dividing network coupled to the phased array transmit antenna; and
a plurality of active relays coupled between the power combining network and the power dividing network and configured to provide an adjustable power gain to wireless signals received at the phased array receive antenna and transmitted by the phased array transmit antenna, wherein the plurality of active relays each comprise a phase shifter configured for beam steering of the phased array receive and transmit antenna.

11. The high gain active relay antenna system of claim 10, wherein a plurality of phases at the plurality of receive antenna elements are aligned with a plurality of phases at the plurality of transmit antenna elements.

12. The high gain active relay antenna system of claim 10, wherein the transmit antenna elements and the receive antenna elements are manufactured from metastructures.

13. The high gain active relay antenna system of claim 10, wherein at least one of the plurality of active relays further comprises a series of amplification stages.

14. The high gain active relay antenna system of claim 13, wherein at least one of the series of amplification stages comprises a power amplifier stage.

15. The high gain active relay antenna system of claim 13, wherein at least one of the series of amplification stages comprises a low noise amplifier stage.

16. The high gain active relay antenna system of claim 13, wherein at least one of the series of amplification stages comprises a linear amplifier stage.

17. The high gain active relay antenna system of claim 10, further comprising:
   an automated gain control configured for independently controlling and maintaining the wireless signals received at the phased array receive antenna and transmitted by the phased array transmit antenna.

18. A method for operation of a high gain active relay antenna system, comprising:
   receiving, via a first receive antenna, forward wireless signals in a forward link from a base station;
   transmitting, via a first transmit antenna, the forward wireless signals in the forward link to a plurality of users;
   receiving, via a second receive antenna, return wireless signals in a return link from the plurality of users;
   transmitting, via a second transmit antenna, the return wireless signals in a return link to the base station,
      wherein the first receive antenna, the first transmit antenna, the second receive antenna, and the second transmit antenna each comprise a phased array antenna;
   adjusting, by a first active relay section, a gain of the forward wireless signals; and
   adjusting, by a second active relay section, a gain of the return wireless signals,
      wherein the first active relay section is coupled between the first receive antenna and the first transmit antenna, and the second active relay is coupled between the second receive antenna and the second transmit antenna, and
      wherein the first active relay section and the second active relay section each comprise a phase shifter configured for beam steering of the phased array antenna.

19. The method of claim 18, wherein the first and the second active relay sections each further comprise a series of amplification stages.

20. The method of claim 18, further comprising:
   independently controlling and maintaining, via an automated gain control, the forward link and the return link.

* * * * *